(12) United States Patent
Siury et al.

(10) Patent No.: US 7,993,936 B2
(45) Date of Patent: Aug. 9, 2011

(54) SYSTEM AND METHOD FOR CONTROLLING AN ELECTROCHEMICAL ETCH PROCESS

(75) Inventors: Kerstin Siury, Dresden (DE); Niels Rackwitz, Dresden (DE); Joern Schnapke, Radebeul (DE); Frank Kuechenmeister, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 117 days.

(21) Appl. No.: 11/855,404

(22) Filed: Sep. 14, 2007

(65) Prior Publication Data

US 2008/0160650 A1 Jul. 3, 2008

(30) Foreign Application Priority Data

Dec. 29, 2006 (DE) .......................... 10 2006 062 037

(51) Int. Cl.
*H01L 21/00* (2006.01)
(52) U.S. Cl. .............. 438/8; 438/669; 438/746; 216/84; 257/E21.525
(58) Field of Classification Search .............. 438/8, 745, 438/746, 669; 216/84, 85, 86; 257/E21.216, 257/E21.215, E21.521, E21.525, E21.529, 257/E21.53, E21.531
See application file for complete search history.

(56) References Cited

U.S. PATENT DOCUMENTS

| 4,338,157 | A | * | 7/1982 | Kanda ............................. 438/6 |
| 4,886,590 | A | * | 12/1989 | Tittle ............................. 204/232 |
| 4,886,890 | A | * | 12/1989 | Chaudhuri et al. ............ 548/519 |
| 5,937,320 | A | * | 8/1999 | Andricacos et al. ........... 438/614 |
| 2001/0036746 | A1 | * | 11/2001 | Sato et al. ..................... 438/745 |

FOREIGN PATENT DOCUMENTS

DE 10 2005 004 360 A1 8/2006
DE 10 2006 024 910 A1 12/2006

OTHER PUBLICATIONS

Translation of Official Communication from German Patent Office for German Patent Application No. 10 2006 062 037.2 dated Jan. 9, 2009.

* cited by examiner

*Primary Examiner* — Julio J Maldonado
(74) *Attorney, Agent, or Firm* — Williams, Morgan & Amerson, P.C.

(57) ABSTRACT

By evaluating a status signal on the basis of a fault detection classification mechanism in an electrochemical etch tool, a corresponding failure status of the tool may be obtained for each single substrate, thereby significantly reducing the risk of significant yield loss compared to conventional strategies. The fault detection and classification mechanism may be advantageously applied to the electrochemical removal of underbump metallization layers during the formation of solder bump structures.

22 Claims, 5 Drawing Sheets

SYSTEM AND METHOD FOR CONTROLLING AN ELECTROCHEMICAL ETCH PROCESS

BACKGROUND OF THE INVENTION

1. Field of the Invention

Generally, the present disclosure relates to the electrochemical treatment of a surface of a substrate used for forming microstructural features, such as circuit elements of integrated circuits, using a reactor and a movable electrode or fluid application assembly to remove material from the substrate surface.

2. Description of the Related Art

In many technical fields, the electrochemical treatment of a substrate surface, such as the deposition of metal layers on, and/or the removal of metal from, the substrate surface, is a frequently employed technique. For example, for efficiently depositing relatively thick metal layers on a substrate surface, plating, in the form of electroplating or electroless plating, has proven to be a viable and cost-effective method and, thus, electroplating has become an attractive deposition method in the semiconductor industry. Similarly, the removal of metal from exposed substrate surfaces is frequently performed on the basis of an electrochemical treatment, which is also referred to as electrochemical etching.

Generally, electrochemical deposition or removal of metals, such as electroplating or electrochemical etching, may be accomplished on the basis of an appropriate electrolyte containing respective metal ions that are electrically neutralized at the substrate surface, which may act as the cathode during electroplating, thereby resulting in the deposition of metal atoms on the electrically negative surface. The amount of metal deposited is proportional to the current flowing through the electrolyte according to Faraday's law. Similarly, during electrochemical etching, the substrate surface may act as a consumable anode, wherein the metal atoms of the substrate surface that is in contact with the electrolyte solution are ionized and dissolved into the solution. The corresponding metal ions may, depending on the chemistry of the metal and the salt in the solution, deposit on a respective cathode, as previously described with respect to the electrochemical deposition, fall out as precipitate or stay in the solution.

During the last decade, copper has become a preferred candidate for forming metallization layers in sophisticated integrated circuits, due to the superior characteristics of copper and copper alloys in view of conductivity and resistance to electromigration compared to, for example, the commonly used aluminum. Since copper may not be deposited very efficiently by physical vapor deposition, for example by sputter deposition, with a layer thickness on the order of 1 μm and more, electroplating of copper and copper alloys is presently a preferred deposition method for forming metallization layers. Using the copper damascene approach, that is, forming metallization layers by filling vias and trenches previously patterned into a dielectric layer with metal on the basis of an electrochemical deposition process, much experience has been gained in the field of semiconductor manufacturing with respect to electrochemical processes and chemistries. It has been recognized that the electrochemical processes may have the potential of applicability in many other opportunities in the field of semiconductor manufacturing. Thus, in addition to metal deposition using electrolytic and/or electroless processes, electrochemical etching, electrophoretic deposition, anodization, electropolishing and the like may also be used in various manufacturing stages. Generally, electrochemical deposition may be divided into "through-mask" deposition and blanket deposition, each regime requiring respective electrochemical process tools and strategies. For example, the copper damascene regime is one of the presently most important blanket deposition techniques, in which the metal is blanket deposited above a patterned surface, while, after the deposition, excess material may be removed on the basis of planarization techniques, such as chemical mechanical polishing (CMP), electrochemical etching and the like in order provide the isolated metal regions.

A typical process representing the through-mask deposition regime is the electro-chemical deposition used for chip packaging. The process of forming solder bumps for directly connecting the solder bumps to respective solder pads of a package material is increasingly gaining in importance due to a plurality of advantages offered by this packaging technique. For example, increased input/output capability for the same chip area may be obtained compared to wire bonding in which the bond pads are substantially restricted to the periphery of the chip. The solder bumps are typically formed on an appropriate metallization layer stack, which may sometimes be referred to as underbump metallization that provides the desired adhesion and electrical, mechanical and thermal characteristics during the deposition process and during operation of the device. For example, titanium and tungsten may frequently be used in combination with copper and chromium for underbump metallization layers, wherein a substantially pure copper layer may be provided as the last layer, on which the solder material may be deposited to form a highly stable intermetallic compound upon re-flowing the deposited solder material. During the electrochemical deposition of the solder material, the underbump metallization layer may also act as a current distribution layer and a seed layer for the appropriate initialization of the electrochemical process. By forming a deposition mask, such as a resist mask, the deposition of the solder material may be restricted to well-defined locations on the underbump metallization, thereby also defining the lateral dimensions of the solder bumps. After the electrochemical deposition of the solder material, the continuous underbump metallization layer has to be removed from dedicated locations in order to provide electrically isolated solder bumps. For this purpose, the copper-based metals of the underbump metallization layer may be efficiently removed on the basis of electro-chemical etch techniques, while the adhesion layer, such as the titanium/tungsten layer, may require sophisticated wet and/or dry chemical etch techniques.

The electrochemical removal of the copper material is, among other factors, one important aspect that determines the finally achieved uniformity of the solder balls after re-flowing the solder bumps. During the re-flow process, the copper-based material that has been maintained after the electrochemical etching process defines an island of wetting material for the liquid solder material, thereby also determining the lateral dimension and thus the height, as well as the adhesion strength, of the solder ball. That is, during the re-flow process, the molten solder material forms a metallic compound with the copper-based wetting surface, wherein the corresponding process is substantially restricted to the area of the wetting surface, thereby creating a solder ball firmly connected to the wetting surface with a substantially round shape outside the wetting surface caused by gravity and the surface tension of the molten solder material. Hence, a precise definition of the lateral dimension of the wetting surface during the electrochemical etching process requires a precise and uniform degree of "undercut" and a reliable removal of unwanted wetting material between the solder bumps during the etch process, in which the solder bumps act as an etch mask.

Thus, the selective removal of the seed layer(s) of the underbump metallization requires accurate control of the uniformity of the removal rate within individual substrates and among a plurality of substrates in order to obtain a reliable electrical connection of the solder balls with respective solder pads of a chip package during chip packaging, since failure of one single solder ball/pad connection out of the hundreds or thousands of connections may render the device non-operational.

One specific type of an electrochemical etch tool is a reactor using jets of electrolyte and a scanning cathode of defined lateral dimensions that is moved relative to the substrate surface, thereby providing enhanced control of the removal rate. It has been recognized that the removal of material of the conductive seed layer(s) across the entire substrate surface on the basis of a cathode exposing the entire substrate surface may result in moderate process non-uniformities, since layer portions located more closely to the current source may be removed more efficiently compared to remote layer portions, thereby possibly isolating remote areas and thus disconnecting these isolated layer portions from the required current flow prior to completely removing these layer portions. By scanning a cathode of restricted dimensions across the substrate while supplying electrolyte solution between the gap formed between the scanning cathode and the surface to be etched, well-defined process conditions may be locally established on the basis of the gap distance, the scanning speed, the process voltage or current and the like, wherein the locally restricted process area may provide enhanced uniformity, reduced current capability required for the current source, increased process flexibility and the like, as for instance the scanning speed may be used as an efficient process parameter for adjusting the overall process performance.

For example, in some systems for electrochemical etching, a substantially rectangular etch bar or paddle may be moved in a linear motion across the surface to be etched, which is mounted in an appropriate substrate holder with the surface facing downward into a container for receiving electrolyte solution that is applied to the surface portion presently overlapping with the moving cathode by means of respective openings provided on the moving cathode. The cathode may be attached to a drive assembly. During operation of conventional systems, such as the one described above, the mechanical components of the drive assembly attached to the tool frame and thus to the container at the bottom area of the tool, such as rails, ball bearings and the like, may be contaminated by process fluids leaking through respective openings in the frame or container, thereby causing deterioration of these components and resulting in increased process non-uniformities, since non-uniformity of the mechanical response of the drive assembly may result in a non-controlled etch rate during the scanning process. Furthermore, any instabilities with respect to fluid flow, composition of chemicals, temperature fluctuations and the like may also affect the complex etch process, thereby contributing to respective non-uniformities of the solder ball structure.

Although, typically, respective advanced control strategies are applied for maintaining the process parameters within the specific target value ranges for each type of process recipe of the various product types that are processed in the electrochemical etch process tool, the corresponding process non-uniformities may remain undetected over extended process periods, as the respective measurement results reflecting the process output of the process tool may be obtained after the processing of a plurality of substrates. Hence, the delayed response of the delivery of measurement results for characterizing the performance of the electrochemical etch process may result in a significant yield loss upon occurrence of a tool failure or process deviation. Moreover, it may be difficult to distinguish between tool-specific failures, which may require immediate maintenance or may indicate an upcoming tool insufficiency, or process-related deviations that may be compensated for by the control algorithm. Thus, in automated process environments, as are typically used in modern semiconductor fabrication, a plurality of non-usable substrates may be produced before a corresponding failure may be detected, thereby significantly contributing to yield loss in a late manufacturing stage, in which the devices have undergone most of the complex process steps. Furthermore, frequent maintenance events may have to be performed to reduce tool failure induced yield loss, thereby, however, significantly reducing tool availability and process throughput.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that enables the detection of a failure of an electrochemical etch tool on the basis of a status signal obtained during the processing of individual substrates, thereby providing the potential for detecting and thus reacting on deviations from standard process situations prior to process aborts initiated by the process tool itself due to the occurrence of severe process failures. Consequently, the failure status of the electrochemical etch tool may be assessed during each single process run, wherein the status signal may indicate a current tool status in a highly dynamic manner, wherein upcoming device failures may be detected in order to perform respective corrective actions in a controlled manner, for instance by interrupting the further processing of the electrochemical etch tool after completing the processing of the currently treated substrate. For example, the detection of a deviation from standard process situations, also referred to as fault detection, may be accompanied by an efficient classification of the respective faults, thereby significantly enhancing process control and the continuous production yield while also providing the potential for enhancing tool availability and tool throughput.

According to one illustrative embodiment disclosed herein, a method comprises removing material from metal structures formed on a first substrate by an electrochemical etch process performed in an electrochemical etch tool. Furthermore, the method comprises receiving a status signal during the processing of the first substrate, wherein the status signal represents a dynamic behavior of at least one tool parameter during the electrochemical etch process. Furthermore, a current tool status is estimated on the basis of the status signal and the electrochemical etch tool is released for the processing of an additional substrate on the basis of the estimated tool status.

According to another illustrative embodiment disclosed herein, a method comprises processing a first substrate in an electrochemical etch tool that operates on a single substrate basis and monitoring a failure status of the electrochemical etch tool on the basis of a status signal obtained during the processing of the first substrate. Furthermore, the failure status is compared with at least one reference criterion prior to processing an additional substrate.

According to yet another illustrative embodiment disclosed herein, a system comprises an electrochemical etch tool having a moving electrode assembly. The system further comprises a fault detection and classification unit connected to the electrochemical etch tool, wherein the fault detection and classification unit is configured to indicate a failure status of the electrochemical etch tool for each process run on the basis of a status signal.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to electrochemical etch processes in which data collection during individual process runs may be used in order to estimate the current tool status in an efficient and rapid manner so as to provide the potential for recognizing deviations from standard process situations and also for responding thereto in a highly controlled manner on the basis of each process run. For this purpose, an appropriate status signal, which may have encoded therein relevant information on the current tool and process status, may be monitored and may be processed to determine a current failure status of the process tool, wherein the further operating mode and/or the release of the electrochemical etch tool for the next substrate to be processed may be based on the estimated failure status. In this way, negative influences on the overall yield caused by any non-uniformities of the electrochemical etch process resulting from any process failures and/or mechanical failures of the electrochemical etch tool may be significantly reduced. In this way, highly complex electrochemical etch processes, such as the removal of seed layers or portions of underbump metallization layers in bump structures of sophisticated semiconductor devices, may be performed on the basis of a fast fault detection mechanism, thereby reducing the probability of creating wafer scrap within a single lot, while additionally, in some illustrative embodiments, an efficient failure analysis may be performed on the basis of the corresponding tool status so as to reduce respective maintenance efforts and downtime periods.

It should be appreciated that the present subject matter may be highly advantageous in the context of electrochemical etch processes associated with the formation of sophisticated bump structures requiring a uniform and reliable removal of one or more underbump metallization layers, and hence illustrative embodiments disclosed herein refer to an electrochemical etch process performed on substrates including semiconductor devices having formed thereon a bump structure. However, the principles disclosed herein may also be applied to any other situation in which respective metal layers have to be removed in a highly reliable manner on the basis of an electrochemical etch process, for instance during the planarization of previously formed metal layers having an enhanced surface topography and/or during respective processes for refining the surface roughness of metal layers and the like. Thus, unless other-wise explicitly set forth in the specification or the appended claims, the present invention should not be considered as being restricted to electrochemical etch processes used during the formation of bump structures.

Figure 1A:
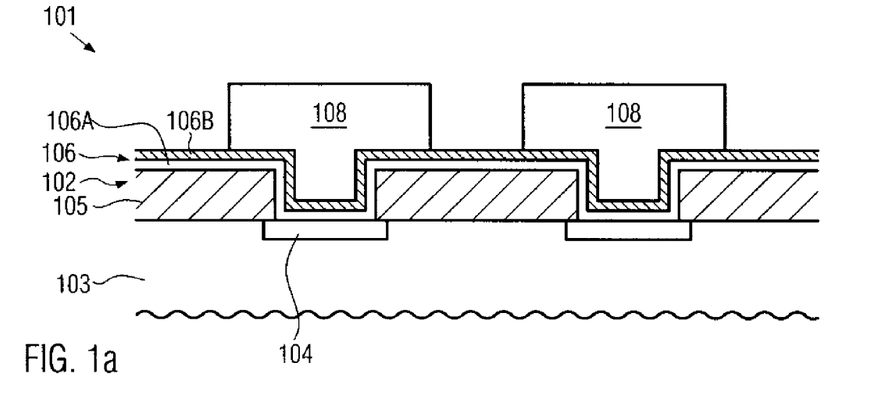
FIGS. 1a-1b schematically illustrate cross-sectional views of a substrate having formed thereon a bump structure during various manufacturing stages in removing a portion of a metal layer on the basis of an electrochemical etch process.

FIG. 1a schematically illustrates a cross-sectional view of a substrate 101 on which a plurality of microstructure devices, such as integrated circuits and the like (not shown), may be formed. For electrically, thermally and mechanically connecting respective microstructure devices to an appropriate carrier or packaging substrate (not shown), an appropriate contact layer 102 may be provided, which may have formed therein a respective bump structure. The substrate 101 may comprise a device layer 103 having formed therein the microstructure devices, such as circuit elements of integrated circuits, some of which may be in electrical contact with one or more of respective contact pads 104, wherein the corresponding electrical contact may be established by means of one or more appropriately designed wiring layers, which may also be referred to as metallization layers. For convenience, any such metallization layers are not shown in FIG. 1*a*. A dielectric layer 105 may be formed above the device layer 103 and may be comprised of any appropriate material, wherein respective openings are formed to allow direct contact to at least a portion of the respective contact pads 104. Formed on the dielectric layer 105 and the contact pads 104 is an underbump metallization layer stack 106, which may comprise a plurality of specific layers in order to provide the required functions, such as diffusion blocking, adhesion to the contact pads 104, thermal and mechanical characteristics, such as thermal expansion, the current distribution during an electrochemical deposition, thereby appropriately seeding and initializing the plating process, and the like. For example, in the embodiment shown, a first layer 106A, which may be comprised of titanium/tungsten or any other appropriate material, may provide the required adhesion and diffusion blocking characteristics, while one or more additional layers, such as a layer 106B, may provide desired characteristics with respect to forming a compound with solder material and the like. For instance, the layer 106B may be provided in the form of a copper layer. Furthermore, the substrate 101 may comprise a plurality of bumps 108, which may be comprised of any appropriate material such as a solder material and which may have a specified size and a well-defined height, which may significantly determine the reliability and characteristics of contacts to be formed when combined with corresponding contact areas of the packaging substrate. In some embodiments, the bumps 108 may be formed by a composition of two or more different metals, which may also represent an important device feature, since the bumps 108 may have to consistently melt at a specified temperature during the reflow process for forming solder balls or for directly contacting respective contact areas of the packaging substrate.

The substrate 101 as shown in FIG. 1*a* may be formed on the basis of the following processes. After forming respective microstructure devices, such as integrated circuits and the like, and the associated metallization levels, on the basis of well-established process techniques, the respective contact pads may be provided on the last metallization level in accordance with established techniques. Thereafter, the dielectric layer 105 may be formed and patterned to receive respective openings to expose portions of the contact pads 104. Thereafter, the underbump metallization layer stack 106 may be formed, for instance on the basis of deposition techniques, such as sputter deposition, chemical vapor deposition (CVD), electrochemical deposition and the like. Thereafter, an appropriately designed resist mask may be formed, which may define the lateral size of the respective solder bumps 108, which may be subsequently formed by an electrochemical deposition process, wherein the underbump metallization layer stack, and in particular the uppermost layer 106B, may act as a seed layer and a current distribution layer. Thereafter, the resist mask may be removed on the basis of well-established techniques.

Figure 1B:
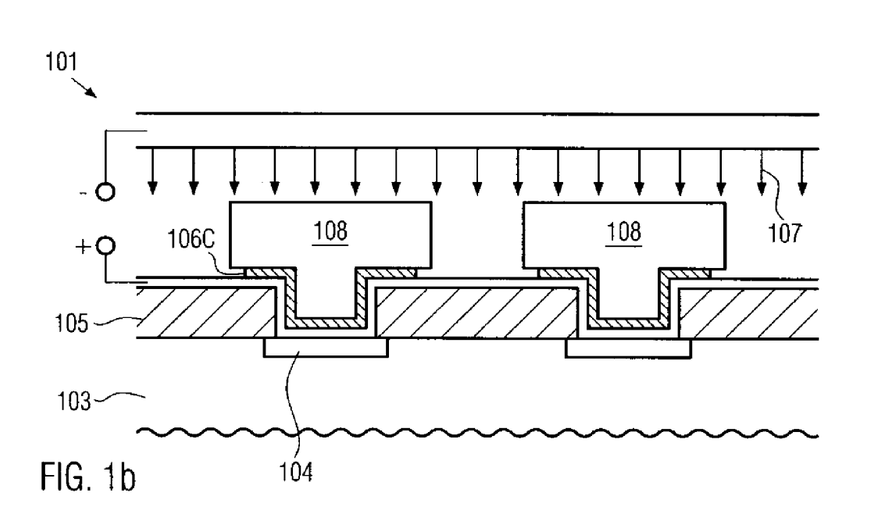

FIG. 1*b* schematically illustrates the substrate 101 in a further advanced manufacturing stage, in which at least a portion of the underbump metallization layer stack 106, for instance the seed layer 106B, may be selectively removed. For this purpose, the substrate 101 is exposed to an electrochemical etch process 107 based on an appropriate electrolyte solution and an electric field, which may be established on the basis of a moving electrode assembly, as will be described later on in more detail. In this case, the substrate surface, i.e., at least the layer 106A, may act as an anode for ionizing respective metal atoms of the layer 106B that is to be removed, while the moving electrode assembly may represent the cathode so that increasingly metal ions are dissolved into the electrolyte solution of the process 107. As previously explained, a high degree of process uniformity may be required to obtain well-defined dimensions of the remaining portions of the layer 106B, now indicated as 106C, which may be responsible for an adequate adhesion of the solder bumps 108 to the contact pad 104 via the adhesion layer 106B and also for the finally obtained lateral size and the height of respective solder balls that may be formed from the solder bumps 108 during reflowing of the bump material. For example, significant process deviations during the electrochemical etch process 107 may result in non-isolated bumps 108 or in inappropriately sized wetting areas, represented by the portions 106C, thereby possibly rendering the respective substrate 101, or at least significant portions thereof, as non-operational devices.

In order to reduce yield loss due to failures in the process 107, which may be caused by tool deviations or other reasons, the electrochemical etch process 107 may be performed on the basis of an appropriately designed process tool, as will be described with reference to FIG. 1*c*.

Figure 1C:
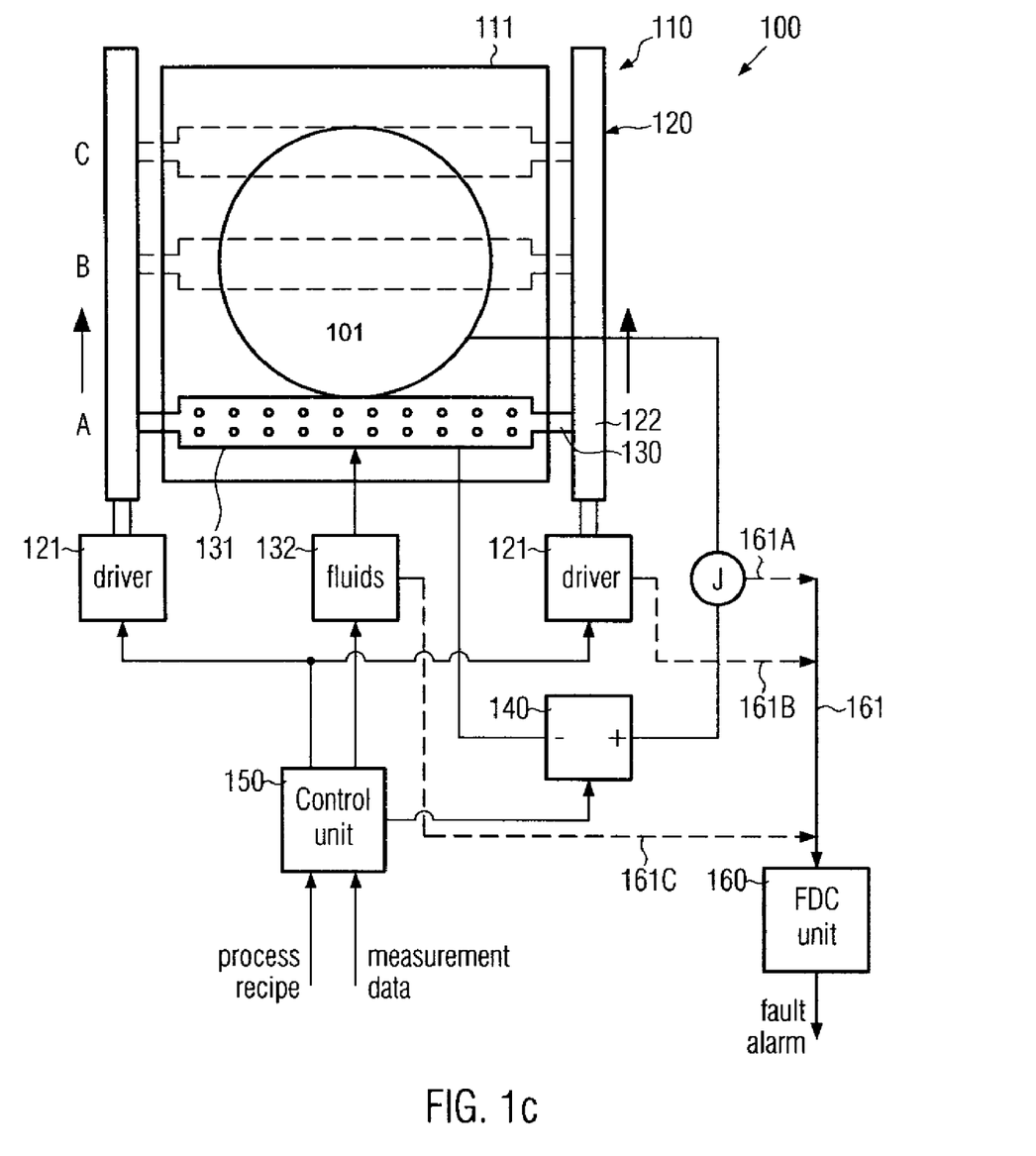
FIG. 1c schematically illustrates a system including an electrochemical etch tool and a fault detection and classification unit connected thereto.

FIG. 1*c* schematically illustrates a system 100 for processing substrates in which metal material has to be removed in a controlled manner, such as a portion of the underbump metallization layer stack 106 of the substrate 101. The system 100 may comprise an electrochemical etch tool 110 including a reactor vessel 111, which is configured to receive therein a substrate, such as the substrate 101, and a movable electrode assembly 130, which is driven by an appropriately designed drive assembly 120. In the embodiment shown, the drive assembly 120 may be configured to establish a substantially linear scan path along which the substantially rectangular electrode surface 131 of the assembly 130 may be moved in accordance with a target scan speed or a corresponding scan speed profile, when the scan speed is to be varied along the scan path. For this purpose, the drive assembly 120 may comprise respective drive sources, such as electric motors 121, in combination with appropriate power transmission systems 122, depending on the tool configuration. Moreover, the system 100 may comprise a fluid reservoir 132 connected to the moving electrode assembly 130 in order to provide respective process fluids, such as electrolyte, water, gases and the like. Furthermore, a power source 140 is connected to the movable electrode assembly 130 and the substrate 101 in order to establish an appropriate electric field for generating a respective current flow between the electrode assembly 130 and the substrate surface to be removed from the substrate 101. Additionally, a respective control unit 150 may be provided that is configured to manage the tool internal components, such as the power source 140, the drive assembly 120, the fluid reservoir 132 and the like. Furthermore, the control unit 150 may be configured to adjust respective process parameters, such as the fluid flow from the reservoir 132 to the electrode assembly 130, the scan speed of the electrode assembly 130, the current flow and the like, on the basis of a specified process recipe, which may specify various target values for the respective process parameters. In other illustrative embodiments, the control unit 150 may have implemented therein any advanced control algorithms in order to appropriately adapt respective target values on the basis of measurement data received from previously processed substrates indicating the process results obtained on the basis of the previously used target values and the corresponding tool and process status. Thus, the measurement data provided to the control unit 150 may enable an efficient process control wherein, however, the response of the control unit 150 may be delayed with respect to any process deviations due to the per se delayed delivery of the measurement data associated with the previously processed substrates. Hence, the control unit 150 may not efficiently enable the immediate detection of any failure states of the currently performed electrochemical etch process.

The system 100 further comprises a fault detection and classification unit 160, which is at least operatively coupled to the electrochemical etch tool 110 for receiving a status signal 161 from the electrochemical etch tool 110. The status signal 161 may be considered as a dynamic status signal in the sense that this signal may be indicative of the presently prevailing tool and process status, thereby also enabling an immediate response, i.e., a response effective for a substrate currently being processed or at least for a substrate to be processed next in the tool 110. Thus, the status signal 161 may represent a signal that is sensitive to a change of at least one tool parameter in an approximately "real-time" manner so as to enable the estimation of the at least one tool parameter during the processing of a single substrate, such as the substrate 101. As previously explained, the electrochemical etch process 107 in the tool 110 is a highly complex process wherein, typically, subtle changes of the process output, such as the degree of etch undercut, i.e., the lateral size of the portion 106C (FIG. 1b), the removal of the layer 106B in unwanted device areas and the like, may be detected upon processing of a plurality of substrates, thereby obtaining corresponding measurement data with a significant delay, which may then be used by the control unit 150 to establish appropriate target values for respective process parameters. Contrary to these delayed measurement data, the status signal 161 may be used for qualifying a single process run of a substrate that is currently being processed.

In one illustrative embodiment, the status signal 161 may comprise a signal 161A that indicates the current flowing between the substrate 101 and the movable electrode assembly 130, wherein the corresponding signal may be obtained at discrete points in time, or, at least during certain time periods, as a substantially time-dependent continuous signal. Since the amount of material removed from the substrate 101 during the electrochemical etch process is proportional to the respective current flow according to Faraday's law, the current over time signal 161A may bear valuable information with respect to the dynamic behavior of the electrochemical removal process. Consequently, the signal 161A may indicate, in a highly dynamic manner, the current process status in the tool 110, which may be assessed and estimated in the fault detection and classification unit 160. An allowable range or limit for the status signal 161 may be established. Consequently, upon detection of an invalid process or tool status based on the status signal 161, for example provided in the form of the signal 161A, the unit 160 may initiate an appropriate response to the detected tool or process status, for instance a controlled interruption of the processing of substrates and initiating a maintenance activity and the like.

During operation of the system 100, when the unit 160 indicates a valid tool status of the tool 110, a substrate, such as the substrate 101, may be loaded into the reactor vessel 111, for instance on the basis of appropriately designed substrate transport and support mechanisms, which are, for convenience, not shown in FIG. 1c. Thereafter, the substrate 101 may be positioned in a corresponding process position to enable an appropriate process environment for the subsequent electrochemical removal of material of the layer 106A. For example, the respective process position of the substrate 101 may be selected such that an appropriate gap may be defined between respective surface portions of the substrate 101 and the moving electrode assembly 130, that is, between the electrode surface 131 and the layer 106A. Thereafter, the moving electrode assembly 130 may be moved along the scan path defined by the drive assembly 120, wherein appropriate process liquids, such as electrolyte, are provided by the electrode assembly 130 while, additionally, the power source 140 may establish a required electric field and thus current flow, as is previously explained. Upon moving the electrode assembly 130 across the substrate 101, a varying degree of "overlap" between the electrode surface 131 and the corresponding substrate surface may be obtained, which may also have a significant effect on the current flow, which may be detected via the status signal 161 by the unit 160.

For instance, in a first position, indicated as position A, the electrode surface 131 may not substantially overlap the substrate surface so that a corresponding current flow may not be established, since a substantially continuous electrolyte flow between the electrode assembly 130 and the substrate surface may not yet be established. Upon further moving the electrode assembly 130, an increasing degree of overlap may be obtained, thereby also increasingly creating a current flow which may be detectable via the status signal 161A. In position B, indicated by the dashed line, the center of the substrate 101 may substantially overlap with the electrode surface 131 so that an increased or maximum current flow may be observed due to the increased substrate area taking part in the corresponding electrochemical etch process. Position C indicates a situation in which the electrode assembly 130 may have substantially reached the other substrate edge, thereby resulting in a reduced current flow due to the reduced substrate area actually taking part in the electrochemical process. Consequently, the current flow over time for a single pass, which may be monitored on the basis of the status signal 161A, may have "encoded" therein the dynamic, i.e., the time-dependent behavior of the electrochemical etch process or at least a portion thereof when several passes are required, wherein respective process deviations, such as a non-uniform removal rate, may be detected on the basis of the corresponding status signal 161A. For example, for obtaining a highly uniform etch result, a specific scan speed or a respective scan speed profile may be used for otherwise given process parameters, such as type of electrolyte, electrolyte flow rate, the gap width between the electrode assembly 130 and the substrate 101, the coverage of the material layer 106A by respective bumps 108 and the like. In this situation, the current over time signal, i.e., the status signal 161A, may depend on the scan speed for the otherwise given process parameters so that a non-uniformity of the scan speed may result in a corresponding variation of the current signal. For example, if several passes of the electrode assembly 130 across the substrate 101 are required for a reliable removal of unwanted layer portions of the layer 106A, respective current variations may be observed between different passes due to a difference of the scan speed at a respective position. Thus, by monitoring the respective current signals of various passes, valuable information on the process status of the electrochemical etch process may be obtained.

In other illustrative embodiments, the status signal 161 may comprise, additionally or alternatively, other signal components, such as a status signal 161B obtained from the drive assembly 120 and/or a status signal 161C obtained from the fluid reservoir 132. Based on the signals 161B and/or 161C, possibly in combination with the signal 161A, the estimation of the tool and process status of the tool 110 and the substrate 101 may be enhanced, for instance by providing detailed information on respective components of the tool 110. For example, the status signal 161B obtained from the drive assembly 120 may include valuable information, such as a position information indicating the accurate absolute position of the electrode assembly 130 when passing across the substrate 101. In this way, respective current values obtained by the signal 161A may be correlated to the actual position of the electrode 130 in a highly precise manner. In other cases, the signal 161B may indicate the mechanical status of various components of the drive assembly 120, for instance by providing an indication with respect to the torque or other motor-related characteristics, such as phase voltages, drive currents and the like, required for reaching the target scan speed, which may vary due to mechanical fluctuations, such as a varying mechanical resistance acting on mechanical components due to contamination by chemicals and the like. Similarly, the signal 161C may give indications about the status of components associated with the supply of electrolyte or other process liquids to the electrode assembly 130, wherein operational pressures, flow rates and the like may be monitored to detect any deviation from standard tool status.

Consequently, based on the status signal 161, which may comprise a plurality of different signal components, such as the signals 161A, 161B and 161C, the unit 160 may estimate the presently prevailing process and tool status, for instance based on appropriately established reference data in order to detect an invalid status requiring a respective activity, e.g., if the signal or signals are above or below a pre-established limit or falls outside of a previously established allowable range. Since the status signal 161 is available during each process run and even during various different phases of a single process run, the corresponding estimation of the current tool and process status may be performed in "real time" so that at least a corresponding response to the currently determined process and tool status may be initiated prior to releasing the tool 110 for processing a subsequent substrate. For example, the unit 160 may instruct the control unit 150 to perform a specific sequence of control activities in correspondence with the detected process and tool status in order to appropriately terminate the processing of the substrate 101 upon the detection of a fault situation and releasing the tool 110 for further processing upon remedying the detected fault situation. For this purpose, the unit 160 may receive the status signal 161, which may include respective raw data of variable length, for instance indicating the current over time behavior, wherein this data may be pre-processed, for instance on the basis of appropriate techniques, including clipping, filtering, modeling or any combination of these techniques and the like, in order to obtain an appropriate data format that may be efficiently compared with respective reference data in order to estimate the tool and process status. For instance, a mixture of statistical key numbers, i.e., of representative values indicating characteristic features of the process under consideration, may be obtained from the corresponding data in the pre-processed or original form and may be fed to a rule-based fault classification engine implemented in the unit 160 and used to determine fault states and fault classes to initiate a corresponding response depending on the determined fault states and fault classes. For example, if defined conditions for failures detected on the basis of the status signal 161 are fulfilled, dedicated alarms may be generated in situ, for instance upon completion of the processing of the substrate 101 within the tool 110, and appropriate interaction with other components of the system 100, such as automated transport activities and the like, may be invoked prior to starting the processing of the subsequent substrate. Furthermore, in some illustrative embodiments based on the respective fault states and fault classes previously recognized, appropriate maintenance actions may be determined.

Moreover, since the respective status signals 161 may be obtained during relevant phases of the corresponding electrochemical etch process, a desired time resolution of estimations of fault status may be adjusted according to requirements by appropriately selecting a data sampling rate for obtaining the status signal 161. That is, depending on the sampling rate for obtaining respective dynamic measurement values of the status signal 161, even certain periods within the entire process sequence of an individual process run in the tool 110 may be estimated with respect to process deviations. For example, for multiple passes of the electrode assembly 130 across the substrate 101, each pass of the electrode assembly 130 or even certain sections thereof may be assessed with respect to the detection of a fault status and the like. In some illustrative embodiments, the respective data processing performed on the status signal 161 in order to estimate the currently prevailing tool and process status may be performed on the basis of strategies that enable a high degree of independence from a respective process recipe that is currently performed in the tool 110. That is, if different product types are to be processed in the tool 110, which may for instance require different target scan speeds and the like, due to differences in the bump structure and the like, the respective pre-processing of the status signal may be performed such that a substantially recipe-independent information may be extracted. For this purpose, the corresponding process data may be normalized with respect to the corresponding process recipe, thereby providing recipe-independent results. For instance, in the above-mentioned case of a different target scan speed used for different substrates, a respective current over time curve may be appropriately "normalized" on the basis of the scan speed to obtain "objective" status results irrespective of the process recipe used.

Figure 1D:
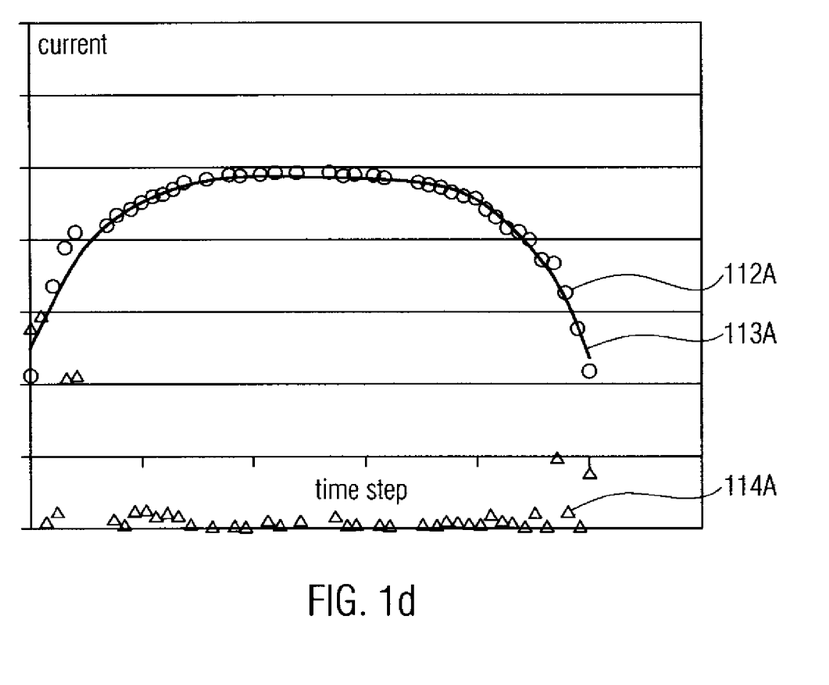
FIGS. 1d-1e schematically illustrate respective raw data and manipulated data obtained from a dynamic status signal according to various process situations.
Figure 1E:
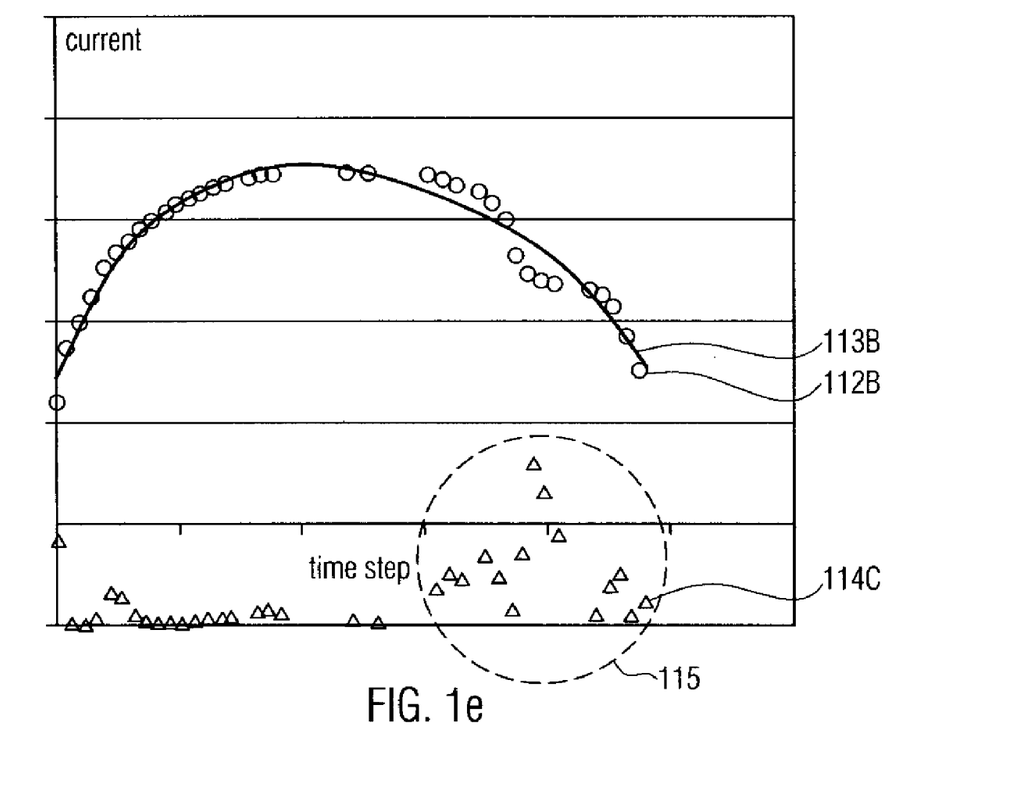

FIGS. 1d-1e schematically illustrate respective data obtained from the status signal 161, wherein, in the illustrated embodiment, the status signal may represent current measurements taken over time so as to indicate the time progression of the current when moving the electrode assembly 130 across the substrate 101.

FIG. 1d schematically illustrates values 112A taken at discrete points in time during the scan motion, while curve 113A may represent a corresponding fit to the discrete data 112A. Based on the respective data 112A and/or 113A, appropriate metrics may be determined, such as representative values, indicated as key numbers, in order to enable an efficient estimation of the respective process and tool status. For instance, respective deviations between the fitted curve 113A and the data 112A may be determined, as is, for instance, indicated by the discrete data values 114A, wherein a respective significant deviation, at least within an appropriate time interval, may be used for determining a failure state of the device 110. In other cases, the shape of the curve 113A may be used for evaluating the status of the electrochemical etch process, possibly in combination with other significant characteristics determined on the basis of the values 112A, the curve 113A and the like. For example, the slope and/or the integral of the curve 113A may be determined, for instance for certain time intervals, so as to create meaningful numbers for characterizing the respective electrochemical etch process. The evaluation may be based on a comparison with appropriately defined reference data, such as respective threshold values for one or more of extracted key numbers and the like. In other cases, appropriate reference curves may be determined for a number of process situations, which may then be used in order to determine the degree of deviation which may then be correlated to a respective tool and process status.

In the example shown, the graph in FIG. 1d may represent a process situation that is within respective process margins, thereby indicating a valid tool and process status.

FIG. 1e may schematically represent a corresponding graph indicating a corresponding current over time signal, represented by respective discrete current values 112B centered around a corresponding fit curve 113B. In this case, a deviation with respect to the graph of FIG. 1d may be evident and may indicate an invalid tool or process status, wherein a corresponding degree of deviation may be assessed on the basis of a comparison of appropriately selected data, wherein the data of FIG. 1d may be used as reference data or wherein both data sets of FIGS. 1d and 1e may be compared to a third set of data, such as measurement data in an appropriately manipulated form, calculated data, or any combination thereof. For example, the general shape of the curve 112B may significantly differ from the shape in FIG. 1d, thereby indicating a different process situation, which may be, in this example, an invalid situation, thereby requiring a respective control activity by the system 100. Similarly, respective deviations of the discrete measurement points 113B with respect to the curve 112B may be determined, indicated as data values 114C, which may also indicate a significant deviation at least within a specific time interval. For example, at a time interval corresponding to the area 115, a significant variation of the corresponding current values may be observed, thereby indicating a corresponding process non-uniformity in this time interval.

It should be appreciated that the corresponding evaluation of data 112A, 112B, 113A, 113B, 114A and 114B may correspond to illustrative embodiments, wherein the current over time behavior of the electrochemical etch tool 110 is monitored and used for estimating corresponding process and tool status so as to recognize respective fault states of the tool 110. As previously explained, appropriate filtering and/or clipping or modeling techniques may be used, possibly in combination, in order to significantly reduce the amount of data or to increase the efficiency of any processes for extracting information from the status signal 161. Efficient filtering techniques, such as high pass filtering, low pass filtering, band pass filtering and the like, may be very efficient in removing unwanted signal components which may otherwise compromise or "obscure" the statistical relevance of extracted values or value ranges. The corresponding values extracted from the raw data may then be compared with certain reference data, such as threshold values and the like, wherein the corresponding reference data may be obtained on the basis of averaged measurement data, models of the electrochemical etch process and the like. Also, the respective reference data may be obtained on the basis of different process and tool situations so as to cover a plurality of different process conditions, if required.

Thus, based on the status signal 161, the fault detection and classification unit 160 may detect at least an invalid tool status by, for instance, comparing one or more statistical key numbers with corresponding reference values and may indicate the corresponding status of the tool 110 prior to processing a next substrate. For this purpose, in some illustrative embodiments, the unit 160 may be operatively coupled to the control unit 150 that in turn may be configured to receive a corresponding fault status indication and to initiate a corresponding tool activity. For example, when an invalid tool status is detected by the unit 160, the control unit 150 may instruct the process tool 110 to discontinue operation upon completion of the etch process presently running in the tool 110. In other embodiments, the unit 160 may, as previously discussed, be configured to estimate the tool status or process status in a more quantitative manner so that the corresponding status indication may enable an enhanced process control by the control unit 150. For instance, the quantitative measure of the presently prevailing tool status determined by the unit 160 may be used as a control variable or as an offset or machine constant for a model predictive control strategy implemented in the control unit 150. For example, based on any measurement data obtained from previously processed substrates, the control algorithm implemented in the control unit 150 may calculate appropriate manipulated variables for the substrate to be processed next in the tool 110, wherein the status indication provided by the unit 160 may be used as an offset value that may provide corrections for each single run, wherein, in particular, the release of the process tool 110 for the next substrate may be determined by the status indication supplied by the unit 160.

In other illustrative embodiments, a plurality of predetermined machine activities may be associated with respective status indications established by the unit 160. For example, a plurality of status codes may have been established, for instance on the basis of reference data and a plurality of well-defined tool conditions, wherein each status code may be associated with a dedicated tool activity, wherein corresponding instruction tables and the like may be implemented in the control unit 150 so as to appropriately respond to the status detected by the unit 160. In some illustrative embodiments, the predefined machine activities may include specific maintenance actions so that a certain degree of self-diagnostic capabilities may be established in the system 100, thereby significantly enhancing tool utilization as the tool 110 may be brought back into a productive state in a highly efficient manner. In one illustrative embodiment, the unit 160, possibly in combination with the control unit 150, may provide a certain predictability of the tool behavior with respect to one or more tool parameters. For example, a certain criterion may be established to predict an estimated time period for the replacement or maintenance of one or more specified hardware components. For instance, the unit 160 may recognize the degradation of a specific component, such as the drive assembly 120, the electrode assembly 130 and the like, which may be compensated for by the respective control mechanisms, for instance by maintaining a desired scan speed irrespective of the mechanical resistance acting on the drive assembly 120, thereby maintaining the process performance even under inferior conditions. In this case, an estimated time for replacement of respective components, such as mechanical components of the drive assembly 120, may be estimated so that the availability of the tool 110 may be estimated more reliably and therefore the overall process flow management in the manufacturing environment of the system 100 may be significantly enhanced. For this purpose, the unit 160 may indicate to an operator or to a supervising control system a corresponding predicted time to maintenance or time to failure of a specific hardware component.

Figure 1F:
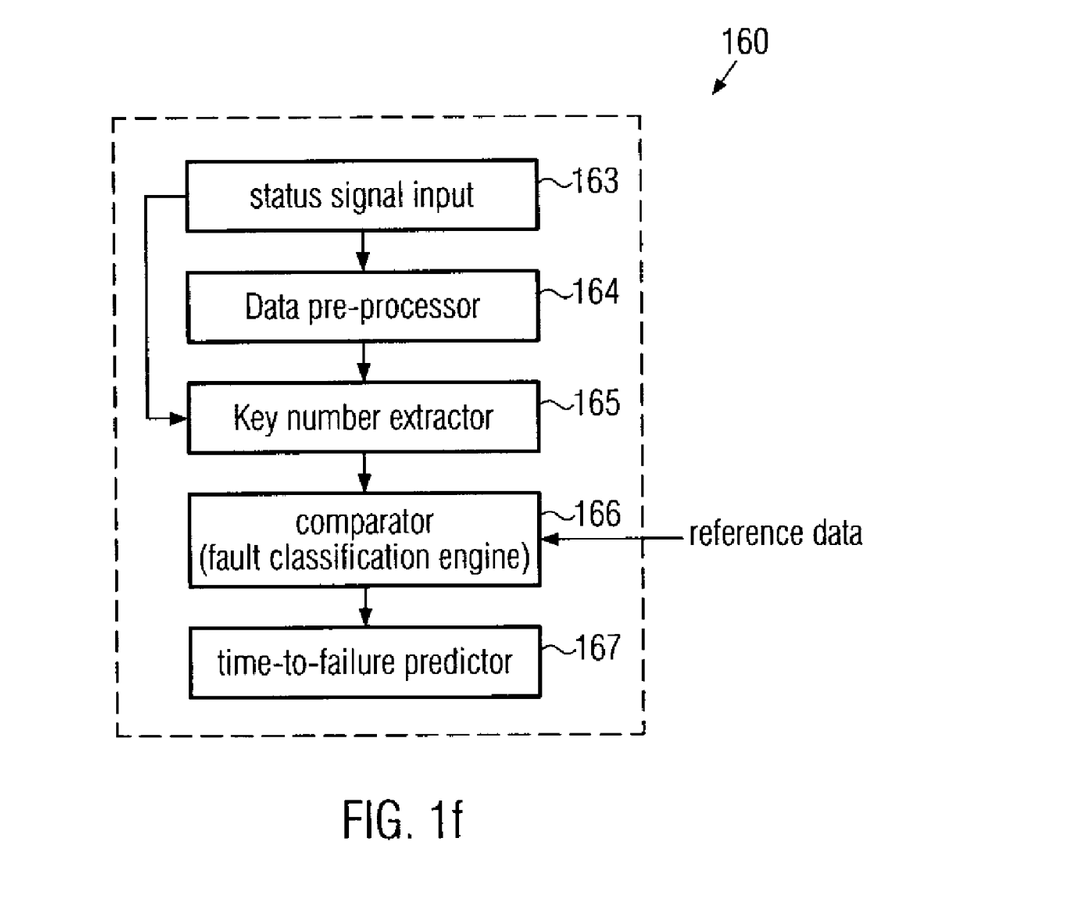
FIG. 1f schematically illustrates a more detailed overview of the fault detection and classification unit.

FIG. 1f schematically illustrates the fault detection and classification unit 160 in more detail in accordance with further illustrative embodiments. The unit 160 may comprise a status signal input 163 which is configured to receive the status signal 161. To this end, the input 163 may comprise hardware components for receiving the signal 161 in analog or digital form, depending on the configuration of a respective data sampling mechanism for obtaining the signal 161. In other embodiments, the input 163 may have incorporated therein an analog-to-digital converter to provide the status signal 161 in digital form for the further processing in the unit 160. Furthermore, a data pre-processor 164 may be provided in some embodiments, wherein the pre-processor 164 may be configured to operate on the data received from the input 163 and to provide the data in a format that allows the fast and reliable extraction of information. For instance, the data pre-processor 164 may comprise any filtering and clipping mechanisms, possibly in combination with other mechanisms, such as modeling and the like, for manipulating the raw data and reducing data complexity by, for instance, discarding certain raw data outside of well-defined time slots and/or outside of predefined value ranges. The unit 160 may further comprise a key number extractor 165 that may be coupled to the data pre-processor 164 and the input 163 so as to operate on the raw data as well as on the pre-processed data of the signal 161. The key number extractor 165 may be configured to reduce the data in a statistically significant manner to provide "meaningful" numbers or number ranges enabling a fast comparison with corresponding reference data. For example, the key number extractor 165 may comprise means and components for integrating and/or differentiating and/or summing and/or transforming and/or multiplying and/or combinations of these processes for operating on the data received. It should be appreciated that any other data manipulation algorithms may be implemented in the key number extractor 165 as long as these algorithms are sufficiently fast to provide the key numbers within a time period that is comparable to the process time of a single substrate in the tool 110.

The unit 160 may further comprise a comparator 166 that is configured to compare the signal 161 or any data obtained therefrom with appropriately formatted reference data, which may be provided by an external source or which may be stored in a memory device (not shown) within the unit 160. It should be appreciated that the comparator 166 may be designed, depending on the available computational power, so as to appropriately compare data as provided by the input 163 and/or by the data pre-processor 164 with corresponding reference data. In one illustrative embodiment, the comparator 166 may be coupled to the key number extractor 165 and may compare reference data provided in the form of respective reference key numbers, with the key numbers provided by the extractor 165, thereby enabling a reliable estimation of the currently prevailing failure status of the tool 110. The comparator 166 may be implemented as a rule-based fault classification engine, which may recognize respective tool status and classify them, for instance, in accordance with a pre-established hierarchical system. For example, the various failure states recognized by the comparator 166 may represent items of different hierarchy levels, which may reflect any tool-specific activities in response to the recognized fault status. For example, a highest hierarchy level or fault class may indicate failures that require an immediate discontinuation of the operation of the tool 110, so that the tool 110 will not be released for the processing of the next substrate. Lower-ranked hierarchy levels may indicate less severe failure states, which may, in some embodiments, be used for enhanced control efficiency in combination with the APC strategies that may be implemented in the control unit 150, as previously described.

Moreover, the unit 160 may comprise, in some illustrative embodiments, a time-to-failure predictor 167 which may be configured to provide a prediction for a time for maintenance or time to failure of one or more specific hardware components. For example, the predictor 167 may estimate on the basis of the hierarchy structure the future behavior of the tool 110. For this purpose, in some embodiments, the predictor 167 may monitor the development of the tool status or an indication thereof over time, i.e., specific key numbers may represent specified aspects of the tool status, wherein the change and the rate of change of moving from one hierarchy level to another may be used in estimating a quantitative measure for the prediction of the failure of a specific component. It should be appreciated that the approach based on a hierarchy structure for predicting the time to failure is of illustrative nature only and other appropriate algorithms may be used. For instance, one or more statistical key numbers may be analyzed with respect to their time progression without using any hierarchical structure, wherein the predictor 167 may instead operate on the basis of corresponding reference data that may have been obtained on the basis of specifically designed test runs or which may have been obtained based on empirical data from a large number of substrates previously processed in the tool 110.

As a result, the disclosed subject matter relates to a method and a system offering significantly increased process reliability by using a status signal during an electrochemical etch process, which may indicate the dynamic behavior and thus the tool and process status in an electrochemical etch tool, thereby providing the potential for estimating a failure status, that is, a deviation from a standard or expected process situation, prior to processing a subsequent substrate. In some illustrative embodiments, the respective status signal may be represented by a current over time signal obtained from an electrode assembly, which may therefore represent the "sensitive" area of the electrochemical etch tool and which therefore implicitly contains information on the tool condition and the currently processed substrate. At least a portion of this information may be extracted and may be used at least for deciding whether or not the tool is to be released for the processing of a subsequent substrate. In other illustrative embodiments, additional information may be obtained in a highly dynamic manner, which may provide more detailed information with respect to certain hardware components of the electrochemical etch tool, such as the drive assembly and the like. In other illustrative embodiments, in addition to identifying an invalid tool status, the information extracted from the status signal may also be used in enhancing the control efficiency of the electrochemical etch tool in that corresponding tool activities may be associated with a plurality of respective tool status that may be recognized on the basis of the status signal. Consequently, an inline process estimation may be established by evaluating a dynamic status signal on the basis of a fault detection and classification mechanism, thereby enabling a controlled interruption of highly complex electrochemical etch processes on a single substrate basis. Thus, a fast response to varying process situations may be accomplished so that the respective yield loss may be reduced, which may be highly advantageous in the context of electrochemically removing materials used in combination with the formation of solder bump structures, as is previously discussed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
removing material from metal structures formed on a first substrate by an electrochemical etch process performed in an electrochemical etch tool, wherein said electrochemical etch tool comprises a power source;
applying an electrical signal to the substrate during at least a portion of the electrochemical etch process using the power source;
obtaining a status signal during the processing of said first substrate, said status signal representing a dynamic behavior of at least one tool parameter during the electrochemical etch process, wherein said at least one tool parameter comprises at least a parameter of said electrical signal;
estimating a current tool status on the basis of said status signal by extracting a plurality of key values from said status signal and comparing said key values with reference key values, wherein said reference key values are obtained on a basis of previously performed electrochemical etch processes for substrates other than said first substrate; and
releasing said electrochemical etch tool for processing an additional substrate on the basis of said estimated tool status.

2. The method of claim 1, further comprising processing additional substrates in said electrochemical etch tool.

3. The method of claim 1, wherein estimating said current tool status comprises providing reference data for at least one reference status of said electrochemical etch tool and comparing said status signal of said first substrate with said reference data.

4. The method of claim 3, wherein providing said reference data comprises defining one or more fault conditions for said at least one tool parameter.

5. The method of claim 4, wherein each fault condition is associated with a specific fault management procedure for the further handling of the electrochemical etch tool.

6. The method of claim 5, wherein each fault management procedure comprises establishing an updated tool status for the processing of said additional substrate by at least one of adapting at least one manipulated variable of a process recipe to be applied to said plurality of substrates and initiating a specific maintenance action.

7. The method of claim 1, further comprising predicting an expected time to failure of at least one hardware component of said electrochemical etch tool.

8. The method of claim 1, wherein extracting said plurality of key values comprises processing raw data of said status signal by at least one of clipping said raw data, filtering said raw data and modeling said raw data.

9. The method of claim 1, wherein said status signal represents a current over time signal obtained from an electrode assembly of said electrochemical etch tool operable to apply said electrical signal to said substrate.

10. The method of claim 1, wherein said metal structures comprise a plurality of bumps used for directly connecting to a package substrate.

11. The method of claim 1, wherein said at least one tool parameter further comprises a position parameter associated with an electrode assembly of said electrochemical etch tool operable to apply said electrical signal to said substrate.

12. The method of claim 1, wherein said at least one tool parameter further comprises a status parameter associated with a component for providing a process liquid to said electrochemical etch tool.

13. A method, comprising:
processing a first substrate in an electrochemical etch tool operating on a single substrate basis, wherein the electrochemical etch tool includes a power source;
applying an electrical signal to said substrate during an electrochemical etch process using said power source;
monitoring a failure status of said electrochemical etch tool on the basis of a status signal generated from said electrical signal obtained during the processing of said first substrate;
obtaining reference data and defining a plurality of reference statuses that represent one or more fault conditions for at least one tool parameter based on said reference data, wherein said reference data are obtained on a basis of previously performed electrochemical etch processes for substrates other than said first substrate; and
comparing said failure status with at least one reference status prior to processing an additional substrate.

14. The method of claim 13, further comprising processing additional substrates in said electrochemical etch tool.

15. The method of claim 13, further comprising at least one of releasing said electrochemical etch tool for processing said additional substrate and initiating a maintenance action on the basis of said comparison.

16. The method of claim 13, wherein each fault condition is associated with a specific fault management procedure for the further handling of the electrochemical etch tool.

17. The method of claim 16, wherein each fault management procedure comprises establishing an updated tool status for the processing of said additional substrate by at least one of adapting at least one manipulated variable of a process recipe to be applied to said plurality of substrates and initiating a specific maintenance action.

18. The method of claim 13, further comprising predicting an expected time to failure of at least one hardware component of said electrochemical etch tool on the basis of said failure status.

19. The method of claim 13, wherein said status signal represents at least one of a voltage signal and a current signal obtained from an electrode assembly of said electrochemical etch tool operable to apply said electrical signal to said substrate.

20. The method of claim 13, wherein processing said substrate comprises selectively removing one or more metal layers of an underbump metallization layer stack of a bump structure, said bump structure being configured for a direct contact to contact regions of a carrier substrate.

21. The method of claim 13, further comprising monitoring the failure status on the basis of a position signal associated with an electrode assembly of said electrochemical etch tool operable to apply said electrical signal to said substrate.

22. The method of claim 13, further comprising monitoring the failure status on the basis of a status parameter associated with a component for providing a process liquid to said electrochemical etch tool during said electrochemical etch process.

* * * * *